United States Patent [19]

Bourgeois

[11] Patent Number: 4,873,465
[45] Date of Patent: Oct. 10, 1989

[54] 2T-CUT PIEZOELECTRIC RESONATOR USING COUPLED CONTOUR MODES

[75] Inventor: Claude Bourgeois, Bôle, Switzerland

[73] Assignee: Centre Electronique Horloger S.A., Neuchatel, Switzerland

[21] Appl. No.: 276,487

[22] Filed: Nov. 28, 1988

[30] Foreign Application Priority Data

Dec. 2, 1987 [FR] France .................. 87 16733

[51] Int. Cl.⁴ .......................................... H01L 41/08
[52] U.S. Cl. .................................. 310/361; 310/323; 310/366; 310/367
[58] Field of Search .............. 310/360, 361, 365, 366, 310/367, 370, 321, 323

[56] References Cited

U.S. PATENT DOCUMENTS

| 4,253,036 | 2/1981 | Kizaki | 310/370 |
| 4,450,378 | 5/1984 | Hermann et al. | 310/367 X |
| 4,469,979 | 9/1984 | Chuang | 310/367 X |
| 4,724,351 | 2/1988 | Eer Nisse et al. | 310/367 X |

FOREIGN PATENT DOCUMENTS 0086739  8/1983  European Pat. Off. .
0074414  6/1980  Japan .................. 310/367

OTHER PUBLICATIONS

Proceedings of the 39th Annual Frequency Symposium, 1985, 29-31 May 1985, IEEE, J. W. Hermann.

Primary Examiner—Mark O. Budd
Attorney, Agent, or Firm—Arnold, White & Durkee

[57] ABSTRACT

The piezoelectric resonator (1) comprises two plates (5,6) and at least two parallel bars (2 to 4) connecting the plates (5,6) to each other. The orientation of the quartz wafer in which the resonator (1) is cut and the arrangement of the electrodes (9 to 11, 15 to 17) on the bars (2 to 4) are such that these bars (2 to 4) vibrate in an elongation mode. The elongation mode of the bars is coupled to a plate and bar flexure mode to improve the thermal properties of the resonator. This resonator can be used in devices in which the dimensions of the resonator have to be as small as possible and/or in which its resonance frequency has to be as low as possible.

8 Claims, 4 Drawing Sheets

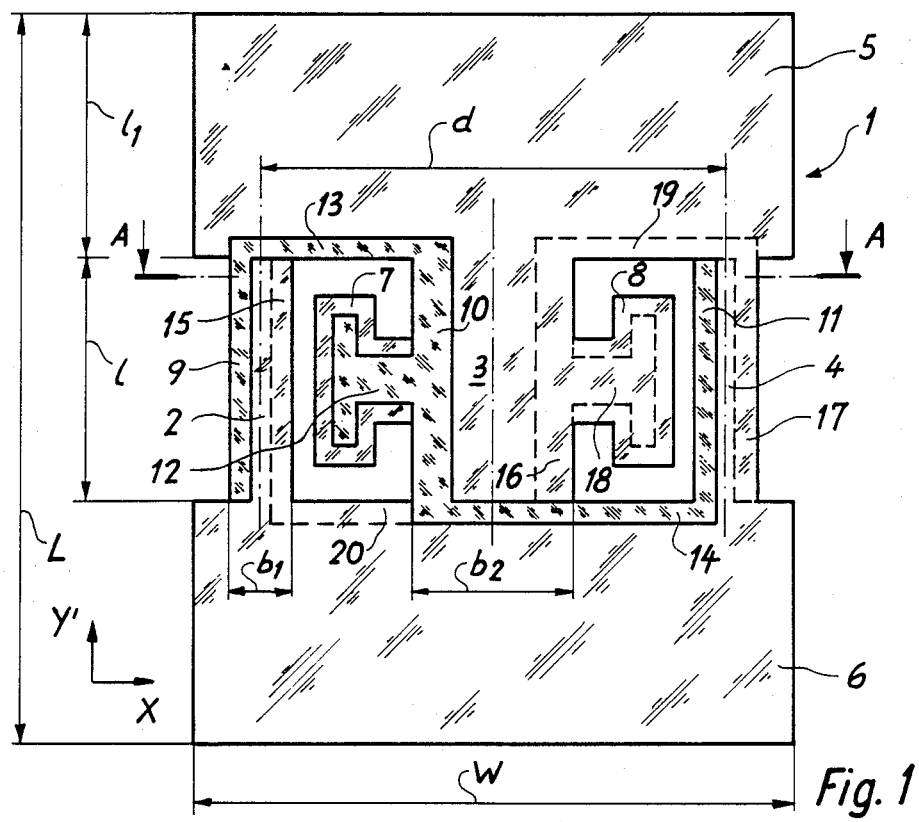
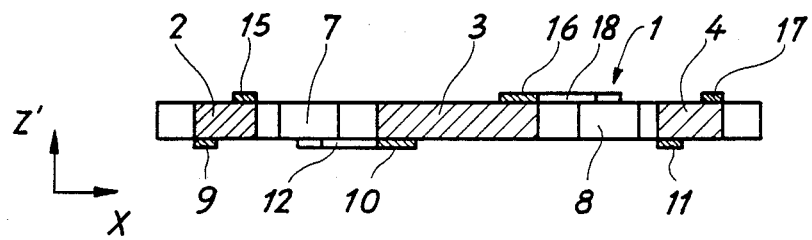

2T-CUT PIEZOELECTRIC RESONATOR USING COUPLED CONTOUR MODES

The present invention relates to a piezoelectric resonator comprising two plates, at least two parallel bars connecting the plates to each other, and means for exciting a vibration of the resonator in a first contour mode.

BACKGROUND OF THE INVENTION

European Patent Application EP-A-0086739 describes a resonator comprising plates connected by resonating arms, formed in a ZT-cut quartz wafer and vibrating in its plane.

This cut is defined, for example, in the U.S. Pat. No. 4,313,071, and will not therefore be described here.

This resonator is excited in an elongation mode and its cut is such that no other vibration mode is coupled to this elongation mode at the utilization temperature.

The length of the arms of this resonator is determined such that their resonance frequency, when driven by the plates, is equal to that of the latter.

The ZT cut of this resonator permits the obtainment of very good thermal properties and renders it producible by mass production techniques, such as chemical attack techniques. Owing to its shape, it may be easily fixed to a case by the intermediary of an embeddable zone. However, as will be seen below, the operating frequency and/or the dimensions of this resonator make it unsuitable for uses where both small size and low consumption are required.

In fact, for a thin bar of the length "1" vibrating in elongation, its frequency f is linked to its length by the relationship $f \times 1 = C/2$, where C represents the velocity of propagation of the extensional wave in the bar. In the case of the abovementioned resonator, the length of the plates and that of the bars being approximately equal, the length L of this resonator is thus linked to its frequency by the relationship $f \times L = 3C/2$.

From this it may be seen that, for a given resonance frequency f, the total length L of the resonator can be quite large, or that, for a given total length L the resonance frequency f of the resonator can be quite high.

There exist numerous devices using piezoelectric resonators, in particular small electronic timepieces such as wrist watches, in which the resonator must be as small as possible and have a resonance frequency which is not too high so that the electronic circuits associated with the resonator do not consume too much electric energy.

Owing to the above-mentioned relationship between its total length L and its resonance frequency f, the resonator described above is not ideal for use in such devices.

SUMMARY OF THE INVENTION

One objective of the present invention is to provide a piezoelectric resonator which does not exhibit the abovementioned disadvantages.

Another objective of the invention is to provide a resonator having good thermal properties, vibrating according to contour modes, being easily chemically workable and embeddable and of which the product of the frequency and the total length is lower than that of the resonators of the prior art.

These objectives are achieved by the disclosed resonator as a result of exciting in its bars a vibration in a first contour mode, and the resonator's cut and dimensions are determined such that at least a second contour mode, different from this first contour mode, is coupled to the latter.

BRIEF DESCRIPTION OF THE DRAWINGS

Other objectives, characteristics and advantages of the resonator according to the invention will become clear from the following description of several embodiments of this resonator shown by way of non-limiting examples in the attached drawings.

FIG. 1 is a diagrammatic plan view of one embodiment of the resonator according to the invention;

FIG. 2 is a diagrammatic section of the resonator of FIG. 1 along the axis A—A of FIG. 1;

DETAILED DESCRIPTION OF THE PREFERRED EMBODIMENTS

Figure 3:
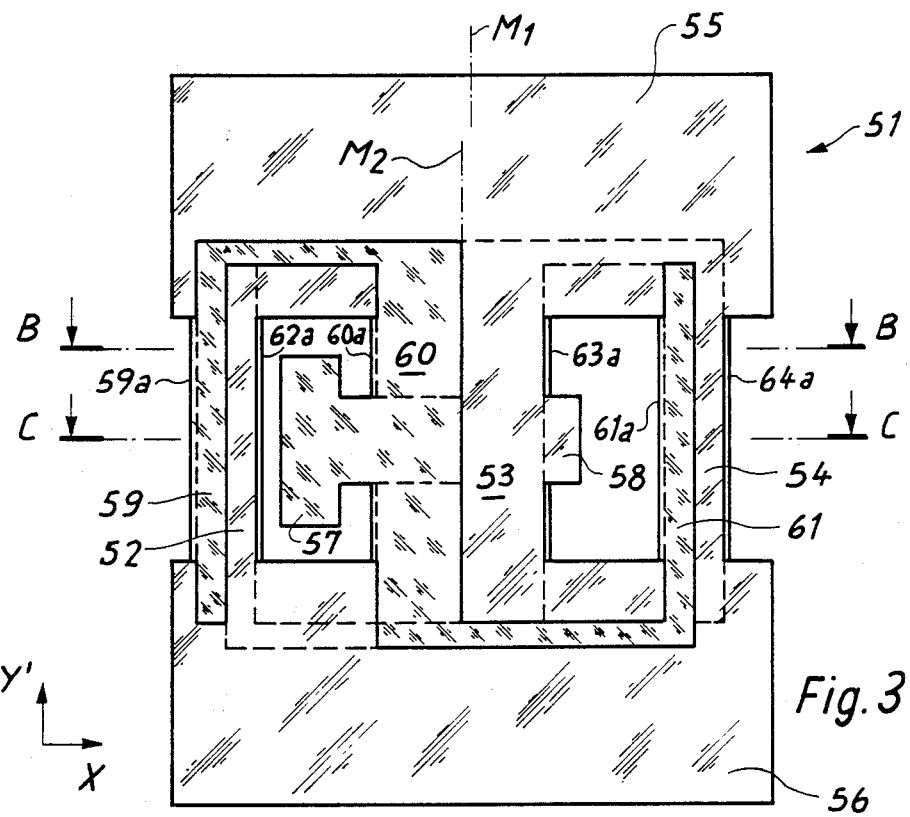
FIG. 3 is a diagrammatic plan view of another embodiment of the resonator according to the invention.

A resonator according to the invention is designated with the reference numeral 1 in the plan view of FIG. 1 and the sectional view, along the axis A—A of FIG. 1, shown in FIG. 2.

Resonator 1 comprises three parallelepipedic bars 2, 3 and 4 arranged parallel to each other and two rectangular plates 5 and 6 each connected to one end of the bars 2, 3 and 4 in such a way that the middle of the width of plates 5 and 6 coincides with the longitudinal axis of central bar 3.

Resonator 1 further comprises two fastening arms 7 and 8 arranged on each side of the central bar 3, substantially half way along it.

All the members 2 to 6 which have just been described form one and the same piece which can be cut, by means of a photolithographic technique known per se, into a thin quartz wafer.

This wafer may be cut in such a way that its plane is parallel to the piezoelectric axis X of the quartz and perpendicular to an axis Z' forming an angle of 2° with the optic axis Z of the quartz. Such a wafer is generally designated as being of X+2° cut.

Using the above technique, resonator 1 can be cut into a wafer where its width W is parallel to the axis X of the quartz; its length L being parallel with an axis Y', perpendicular to this axis X and the above-mentioned axis Z'.

In the rest of this description the face of the resonator 1, or of its members, which is visible in FIG. 1 will be arbitrarily called first face, and that which is not visible will be called second face. The same is true of the other resonators which will be described below.

Resonator 1 has, on its first face, a first electrode in three parts 9, 10 and 11, arranged respectively on the left edges of the three bars 2, 3 and 4.

First electrode part 10 is connected electrically to a connection terminal 12 arranged on fastening arm 7. It is also connected to first electrode parts 9 and 11 by conductor strips 13 and 14 respectively arranged on plates 5 and 6.

The resonator 1 has, on its second face, a second electrode in three parts 15, 16 and 17, arranged, respectively, on the right edge of said three bars 2, 3 and 4.

Part 16 of the second electrode is electrically connected to a connection terminal 18 arranged on fastening bar 8. It is also connected to second electrode parts 15 and 17 by conductor strips 19 and 20 respectively arranged on the plates 5 and 6.

The electrodes 9 to 11 and 15 to 17, the connecting terminals 12 and 18 and the conductor strips 13, 14, 19 and 20 consist of metal layers made, in a known way, during fabrication of the resonator.

It should be noted that each of the connecting terminals 12 and 18 could occupy the entire surface of the fastening arm 7 or 8 on which it is arranged. Similarly these connecting terminals 12 and 18 could be respectively arranged on the first and second faces of the same fastening arm. Such embodiments of the resonator 1 have not been shown.

Fastening arms 7 and 8 are to be connected to a support constituting part of a case which is not shown and are situated half way along the bar 3. They constitute a damping zone for its movements and deformations of the resonator.

The layout of the electrodes described above permits, with the aid of a suitable oscillator, excitation of a resonator bar elongation mode by the bias of the component of the electric field which is parallel to the axis X and in the plane of the resonator.

Since bars 2 to 4 are charged by plates 5 and 6, the product of the frequency f of resonator 1 and its length L can be much lower than that of the resonator of the prior art mentioned above. This product may be expressed by the relationship $f \times L = K \times C/2$.

It may be seen that it is advantageous to select as low as possible a factor K, as the smaller it is the smaller the total length L of resonator 1 can be for a given resonance frequency f, or the lower the resonance frequence f of the resonator can be for a given total length L.

By way of example, for a resonator vibrating at a frequency of approximately 500 kHz, it is possible to select a value for factor K as low as 0.7.

In this example, the total length of the resonator corresponding to this value is of the order of 4 millimetres, which is acceptable for most applications.

Thus, it may be seen that, at equal lengths, the resonance frequency of resonator according to the invention is more than four times lower than that of the known resonator of the prior art described in the background.

This important advantage of the resonator according to the invention with respect to the known resonator allows much easier utilization of the former than of the latter in the abovementioned devices where space availability is very limited and, above all, where the electric energy consumption must be the lowest possible.

It should be noted that the shapes of the different elements of the resonator 1 (plates and bars) can be different from the rectangular shape which they have in FIG. 1.

It is known that the thermal behavior of a quartz resonator may be validly represented by the following third degree polynomial:

$$f = f_0[1 + \alpha(t-t_o) + \beta(t-t_o)^2 + \gamma(t-t_o)^3],$$

where t represents the temperature in degrees celsius, $f_o$ the frequency of the resonator at the temperature $t_o$ and $\alpha$, $\beta$ and $\gamma$ respectively represent the first, second and third order temperature coefficients.

The values of the coefficients $\alpha$, $\beta$ and $\gamma$ depend on the cut of the quartz and the dimensions of the various elements of the resonator.

Since the resonator of the invention is formed in an X+2° cut quartz wafer and vibrates in an elongation mode, the coefficient $\alpha$ mentioned above is very close to zero.

Moreover, according to the invention, the dimensions of the various elements of resonator 1 are selected such that the elongation modes of bars 2 to 4 are coupled elastically with flexure modes of the bars and plates 5 and 6 having resonance frequencies close to those of these elongation modes. Owing to this coupling it is possible to obtain a very low value for the second order coefficient $\beta$. The distance d, which separates the axes of the outer bars 2 and 4 or the width W of plates 5 and 6 may be used as parameters for modifying the coupling between the elongation and flexure modes and, consequently, improving the thermal properties of resonator 1.

By way of example, the above-described resonator has the following characteristics:

| | |
|---|---|
| cut: | X + 2° |
| frequency: | $2^{19}$ Hz |
| total length L: | 3.70 mm |
| total width W: | 2.75 mm |
| thickness: | 0.1 to 0.2 mm |
| length of arms l: | 1.20 mm |
| width of outer arms b1: | 0.30 mm |
| width of centre arms b2: | 0.57 mm |
| distance between the axes of outer arms d: | 1.45 mm |

Figure 4:
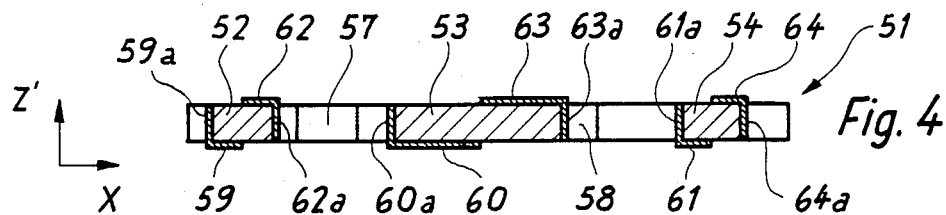
FIGS. 4 and 5 are diagrammatic sections of the resonator of FIG. 3 respectively along the axes B—B and C—C of FIG. 3.
Figure 5:
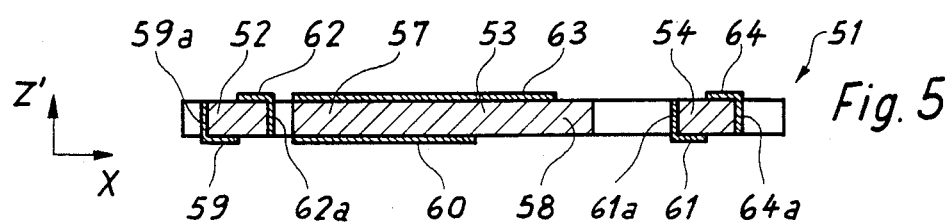

Resonator 51 shown in plan view in FIG. 3 and in section in FIGS. 4 and 5, these sections being respectively along the axes B—B and C—C of FIG. 3, has a general shape similar to that of the resonator 1 of FIGS. 1 and 2.

Like resonator 1, resonator 51 may be cut into an X+2° cut quartz wafer and it comprises three parallel bars 52, 53 and 54 and two rectangular plates 55 and 56 connected to the ends of bars 52, 53 and 54.

The resonator 51 thus has the same advantage as the resonator 1 with respect to the known resonator described above, that is to say that its resonance frequency may be much lower, with the same dimensions, than that of the latter, or that its total length may be much smaller, at the same resonance frequency, than that of this known resonator.

FIGS. 3 to 5 show that the resonator 51 only comprises a single fastening arm, designated 57, which is connected to bar 53 half way along it, and which is designed to be fixed to a support, not shown, constituting part of a case, also not shown.

In the space occupied by fastening arm 8 in resonator 1, resonator 51 comprises only a simple rectangular wafer 58 which, in contrast to fastening arm 57, is not designed to be fixed to a support.

The fastening arm 57 and wafer 58 form, of course, one and the same piece with bar 53, and therefore with the rest of resonator 51.

The fact that resonator 51 is fixed asymmetrically by the sole fastening arm 57 and the presence of wafer 58 allow compensation of the dissymmetries which can be generated, for example, by a chemical attack fabrication method.

It is also possible, in order to compensate the effects resulting from the chemical attack and especially to improve the quality factor of the resonator, to stagger slightly the position of bars 52, 53 and 54 with respect to the central axis of plates 55 and 56. This staggering appears in FIG. 3 where M1 represents the position of the central axis of plates 55 and 56 and M2 represents the position of the central axis of bars 52 to 54.

It is evident that the steps which have just been described do not have to be taken together always but may, depending on the case, be applied singly.

Resonator 51 has, on its first face, a first electrode in three parts 59, 60 and 61 arranged respectively on the left edges of bars 52, 53 and 54 and, on its second face, a second electrode in three parts 62, 63 and 64 arranged respectively on the right edges of these bars.

This arrangement of electrodes 59 to 64 is thus similar to that of electrodes 9 to 11 and 15 to 17 of resonator 1. It may be seen, however, in FIGS. 3 to 5 that the width of the electrodes 59 to 64 has been increased over the electrodes of FIGS. 1 and 2, such that each of them occupies half the width of the bar on which it is arranged.

Furthermore, still with respect to electrodes 9 to 11 and 15 to 17 of FIGS. 1 and 2, the length of electrodes 59 to 64 has also been increased such that they extend over one part of plates 55 and 56.

These two steps, which may be taken independently of each other, each have the effect of increasing the piezoelectric coupling factor of resonator 51 with respect to that of resonator 1; the vibration modes, dimensions and thermal properties being, moreover, identical for the two resonators.

FIGS. 3 to 5 illustrate a third step which may be taken, alone or in combination with the other above-mentioned steps, to increase still more the value of the piezoelectric coupling factor.

This step entails providing resonator 51 with lateral electrodes 59a to 64a which are individually arranged on one of the sides of one of bars 52 to 54 and which are each connected to the electrode 59 to 64 which is adjacent to it.

Although the preceding embodiments have been described within the framework of an X+2° cut, other cuts may also be used. However, it is sensible to take into account, in the choice of cut of the quartz, criteria such as: piezoelectric coupling sufficient to excite the elongation modes of the bars, value of the temperature coefficients or ease of chemical cutting.

Among the possible arrangements, it is possible to cite by way of non-limiting example those which are given the name of ZT or GT cut, as well as those similar to that used for resonator 1 of FIG. 1, in which the plane of the wafer is parallel to the axis X of the quartz and in which the line normal to this plane forms an angle of between approximately −10° and +10° with the axis Z of the quartz.

Figure 6:
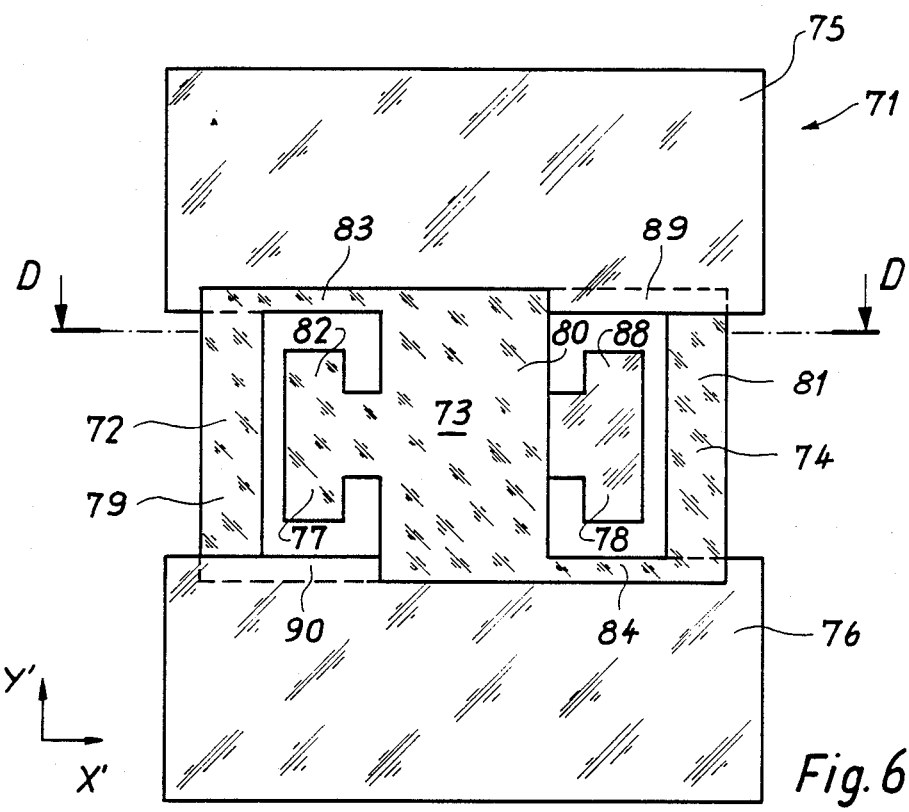
FIG. 6 is a diagrammatic plan view of another embodiment of the resonator according to the invention.
Figure 7:
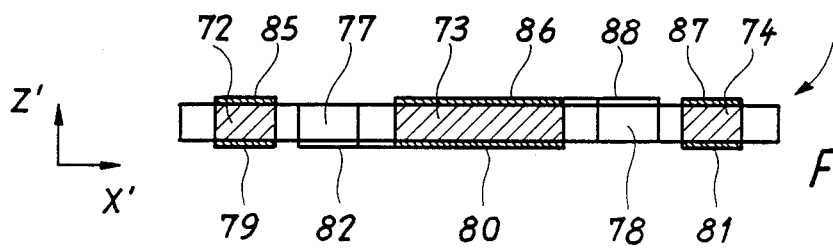
FIG. 7 is a diagrammatic section of the resonator of FIG. 6 along the axis D—D of FIG. 6.

In the embodiment shown in FIGS. 6 and 7 the resonator according to the invention, designated 71, has been cut into a ZT cut quartz wafer.

This ZT cut is known, especially from the patent CH-A-623690 and will not be described here.

Like the resonator 1 of FIGS. 1 and 2, the resonator 71 comprises three parallel bars 72, 73 and 74 connected to two rectangular plates 75 and 76.

The resonator 71 further comprises two fastening arms 77 and 78 arranged substantially half way along the central bar 73.

Three parts 79, 80 and 81 of a first electrode respectively occupy the entire first face of each bar 72, 73 and 74.

A connecting terminal 82 is arranged on the first face of fastening arm 77 and the three different parts of the first electrode are connected together by conductor strips 83 and 84 arranged on the first faces of plates 75 and 76.

Three parts 85, 86 and 87 of a second electrode respectively occupy the entire second face of each bar 72, 73 and 74.

A connecting terminal 88 is arranged on the second face of fastening arm 78 and the three parts of the second electrode are connected together by two conductor strips 89 and 90 arranged on the second faces of plates 75 and 76.

When connecting terminals 82 and 88 are connected to a suitable oscillator circuit, bars 72 and 74 vibrate in an elongation mode in response to the alternating electric field which is applied to them by electrodes 79 to 82 and 85 to 87.

Like in resonator 1, the resonance frequency of bars 72 to 74 is diminished by the inertia of plates 75 and 76 which are connected thereto.

Resonator 71 thus has the same advantage as resonator 1 over the known resonator of the prior art described in the background.

The considerations given above concerning the determination of the dimensions of resonator 1 in accordance with the characteristics which the resonator must exhibit obviously apply to resonator 71, and to the other resonators of the same type which may be made from quartz wafers of cuts other than those which have been described.

The same is true of the modifications described in connection with FIGS. 3 to 5 and which have the effect of improving the quality factor of the resonators according to the invention.

As far as the other modifications described in connection with FIGS. 3 to 5 are concerned, their application depends on the arrangement of the electrodes on the bars of the resonator, an arrangement which depends in turn on the orientation of the resonator with respect to the axes X, Y and Z of the quartz.

Thus, for example, in the case of the resonator of FIGS. 6 and 7, the only step which may practically be taken to increase the piezoelectric coupling is that which comprises extending electrodes 79 to 81 and 85 to 87 in such a way that they extend over part of plates 75 and 76. In such a case it is advantageous to extend the conductor strips 83, 84, 89 and 90 in such a way as to connect directly the two ends of electrode parts 79 and 81 and, respectively, 85 and 87. These conductor strips then contribute themselves to the piezoelectric coupling of the resonator.

The principles which serve as the basis of the present invention may also be applied to produce resonators with a structure different from that of the resonators which have just been described.

Figure 8:
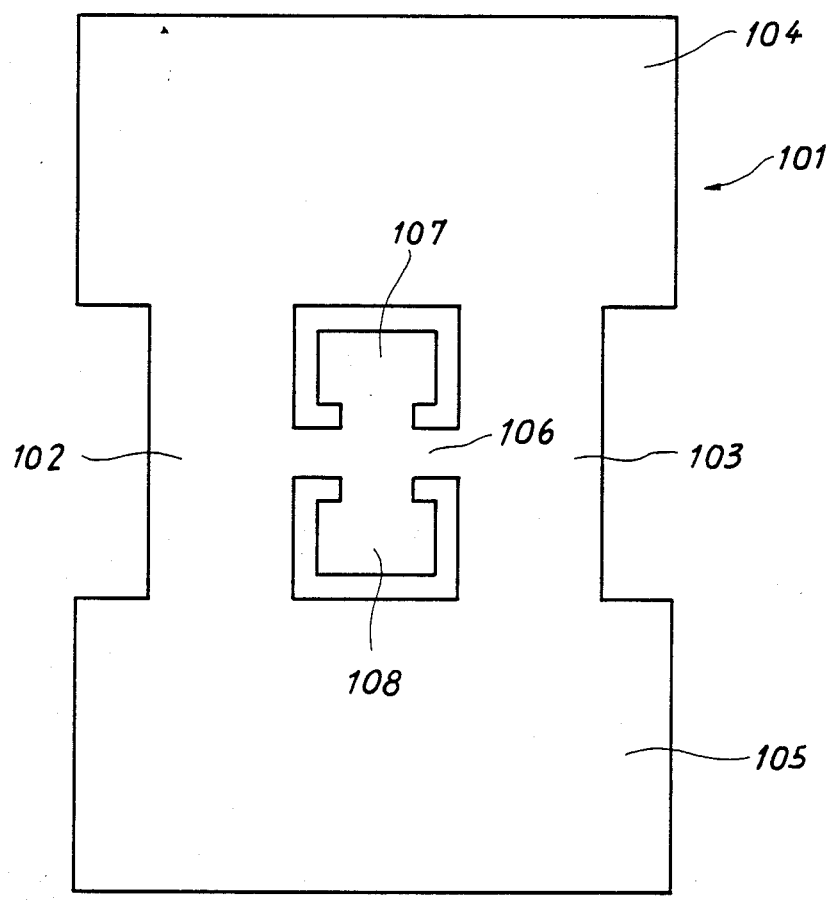
FIG. 8 is a diagrammatic plan view of another embodiment of the resonator according to the invention.

Thus, for example, FIG. 8 shows a resonator 101, in plan view, which comprises only two bars 102 and 103.

The resonator 101 has been cut into a quartz wafer having any one of the arrangements, with respect to the axes X, Y and Z of the quartz, which are suited to the production of resonators vibrating in an elongation mode.

The resonator 101 also comprises two rectangular plates 104 and 105 which are connected to the ends of bars 102 and 103.

These bars 102 and 103 are further connected by a transverse bar 106 situated substantially half way therealong.

This transverse bar 106 carries two fastening bars 107 and 108 similar to fastening arms 7 and 8 of resonator 1 and designed, like the latter, to be fixed to a support constituting part of a case.

Electrodes are arranged on bars 102 and 103 in such a way that, when they are connected to a suitable oscillator circuit, these bars vibrate in an elongation mode, as in the case of the resonators described above.

These electrodes have not been shown, since their arrangement on the bars 102 and 103 depends on the orientation with respect to the axes X, Y and Z of the quartz of the wafer into which the resonator 101 has been cut.

Conductor strips, which are not shown either, connect these electrodes to connecting terminals (also not shown) arranged on fastening arms 107 and 108.

Excited in an elongation mode of bars 102 and 103, the resonator 101 also exhibits a lower frequency by length product than those of the known resonators described in the background of the invention. The cut and dimensions of the resonator according to the invention are determined in such a way that the resonator has a flexure mode coupled to its elongation mode and having a resonance frequency close to that of this elongation mode.

An attempt has also been made to obtain a value close to zero for the coefficients $\alpha$ and $\beta$ and as low as possible for the coefficient $\gamma$, such that the variation in its resonance frequency in accordance with the temperature may be very slight.

In the embodiments of the invention which have been described above, the electrodes exciting the vibration of the resonator are arranged on the latter in such a way that it vibrates in an elongation mode. It has further been seen that the cut and dimensions of this resonator may be determined in such a way that a flexure mode is coupled to this elongation mode, to diminish the resonance frequency variation in accordance with the temperature.

It is evidence that other embodiments of the resonator according to the invention are possible.

In these other embodiments, which will not be described in detail since their production does not pose any particular problems in view of the explanations given above, the resonator according to the invention has the same general shape as one of these described above.

Nevertheless, the electrodes exciting its vibration are arranged in such a way that it vibrates in another contour mode, for example a flexure or surface shearing mode.

In such a case, it is also possible to determine the dimensions of the resonator in such a way that a different contour mode, for example an elongation mode, is coupled to its main vibration mode, with the objective of diminishing the variation of its resonance frequency in accordance with the temperature.

It is also evident to one of ordinary skill in the art that piezoelectric materials other than quartz may be used to produce the resonator according to the invention.

What is claimed is:

1. A piezoelectric resonator comprising two plates, at least two parallel bars connecting said plates to each other, and means for exciting a vibration of said resonator in a first contour vibration mode, wherein said exciting means are arranged for exciting said vibration in said bars and the cut and dimensions of said resonator are such that at least a second contour vibration mode, different from said first vibration mode, is coupled with said first vibration mode.

2. A resonator according to claim 1, wherein said first vibration mode is an elongation mode and said second mode is a flexure mode.

3. A resonator according to claim 1, wherein the resonator is cut from quartz into a flat quartz wafer, where the plane of the wafer is parallel to the piezoelectric axis (x) of said quartz, the line perpendicular to said plane forming with the optic axis (z) of said quartz an angle of between approximately $-10°$ and $+10°$, and the length of said bars having a direction perpendicular to said piezoelectric axis (x); and said exciting means comprise electrodes arranged on the faces of said bars which are parallel to said piezoelectric axis (x) for producing an electrical field with a component parallel to said piezoelectric axis (x).

4. A resonator according to claim 1, wherein the resonator is cut from quartz into a flat quartz wafer where the plane of the wafer is parallel to the piezoelectric axis (x) of said quartz, the line perpendicular to said plane forming with the optic axis (z) of said quartz an angle of between approximately 0 and $\pm 10°$ and the length of said bars having a direction perpendicular to said piezoelectric axis (x), and said exciting means comprise electrodes arranged on the sides of said bars perpendicularly to said piezoelectric axis (x) to produce an electrical field parallel to said piezoelectric axis (x).

5. A resonator according to claim 1, wherein the resonator is cut into a ZT cut wafer in such a way that the length of said bars is parallel to the axis X' of said wafer, and in that said exciting means comprise electrodes each arranged over an entire surface of one of the faces of said bars which are parallel to the axes X' and Y' of said wafer.

6. A resonator according to claim 3, wherein said electrodes further extend over part of said plates.

7. A resonator according to claim 1, which comprises three parallel bars.

8. A resonator according to claim 1, which comprises two parallel bars.

* * * * *